United States Patent
Meier et al.

(10) Patent No.: US 7,371,966 B2
(45) Date of Patent: May 13, 2008

(54) HIGH SPEED ACTIVE FLEX CABLE LINK

(75) Inventors: Pascal C. H. Meier, Sunnyvale, CA (US); Muraleedhara Navada, Santa Clara, CA (US); Sanjay Dabral, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 11/170,980

(22) Filed: Jun. 30, 2005

(65) Prior Publication Data

US 2007/0004241 A1    Jan. 4, 2007

(51) Int. Cl.
    *H04B 3/36*    (2006.01)

(52) U.S. Cl. ............ 174/70 S; 359/333; 359/337; 385/24; 340/600

(58) Field of Classification Search ......... 174/70 S; 359/333, 337; 385/24, 122, 100; 340/600, 340/310.01
    See application file for complete search history.

(56) References Cited

U.S. PATENT DOCUMENTS

| | | | |
|---|---|---|---|
| 3,816,673 A * | 6/1974 | Miya | 174/70 S |
| 5,083,874 A * | 1/1992 | Aida et al. | 385/24 |
| 6,023,602 A * | 2/2000 | Kitajima et al. | 725/149 |
| 6,323,993 B1 * | 11/2001 | Hansen et al. | 359/337 |
| 6,571,042 B1 * | 5/2003 | Kordahi | 385/100 |
| 6,950,229 B2 * | 9/2005 | Young et al. | 359/333 |
| 7,068,419 B2 * | 6/2006 | DeVincentis et al. | 359/333 |
| 2001/0028758 A1 * | 10/2001 | Abbott et al. | 385/24 |
| 2002/0076182 A1 * | 6/2002 | Terahara et al. | 385/122 |
| 2002/0109585 A1 * | 8/2002 | Sanderson | 340/310.01 |
| 2003/0020616 A1 * | 1/2003 | Dodds | 340/600 |
| 2004/0196529 A1 * | 10/2004 | Young et al. | 359/333 |
| 2006/0146921 A1 * | 7/2006 | Vermeersch et al. | 375/222 |

* cited by examiner

*Primary Examiner*—Gary F. Paumen
(74) *Attorney, Agent, or Firm*—Buckley, Maschoff & Talwalkar LLC

(57) ABSTRACT

A method and apparatus, in some embodiments the apparatus includes a flex cable terminating at a first end and a second end and having a plurality of conductors therein, and a repeater circuit disposed between the first end and the second end and connected to at least one of the plurality of conductors to re-transmit a signal transmitted on the at least one of the plurality of conductors.

23 Claims, 6 Drawing Sheets

HIGH SPEED ACTIVE FLEX CABLE LINK

BACKGROUND OF THE INVENTION

A standard printed circuit board (PCB) based interconnect may have significant transmission losses. Transmission losses may be greater at higher frequencies. For example, a 20 inch channel of a multilayer PCB may have a loss of about 37 db at about 10 Ghz. The transmission losses may be reduced by, for example, constructing the PCB using materials having better dielectric characteristics and eliminating or minimizing discontinuities in the PCB.

However, even with better composite materials and elimination or reduction of discontinuities, significant losses may still be observed over long transmission links, particularly at high data rates (e.g., 20 inches at 20 Gigabits/second). Also, the use of better composite materials may be costly to implement.

Thus, there is a general need for an interconnect structure and method suitable for efficient high frequency data transmissions.

DETAILED DESCRIPTION

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

Figure 1:
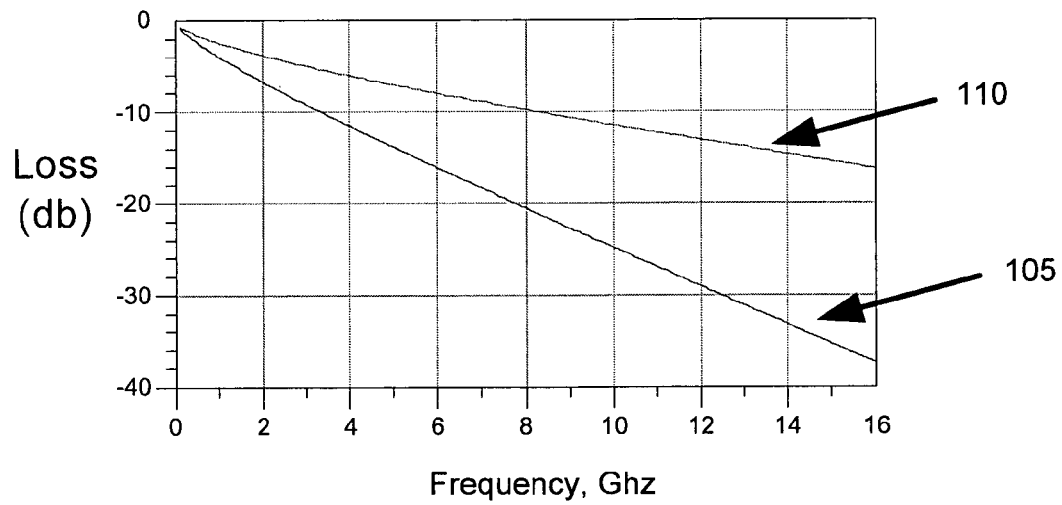
FIG. 1 is a frequency versus signal loss graph.

FIG. 1 is a graph illustrating signal frequency versus signal loss for a PCB transmission channel of about 20 inches. Line 105 represents the loss for FR-4 (Flame Retardant, Type 4 glass reinforced epoxy resin) and line 110 represents the loss for a similar length of low loss flex cable. At about 10 Ghz the material loss is reduced from about 25 db for FR-4 to about 16 db for the flex cable. Thus, the flex cable has a lower conductor loss as compared to commonly used PCB laminate material FR-4. Also, flex cable may be use to avoid some of the discontinuities typically found in PCB interconnects, such as those attributable to vias.

Figure 2:
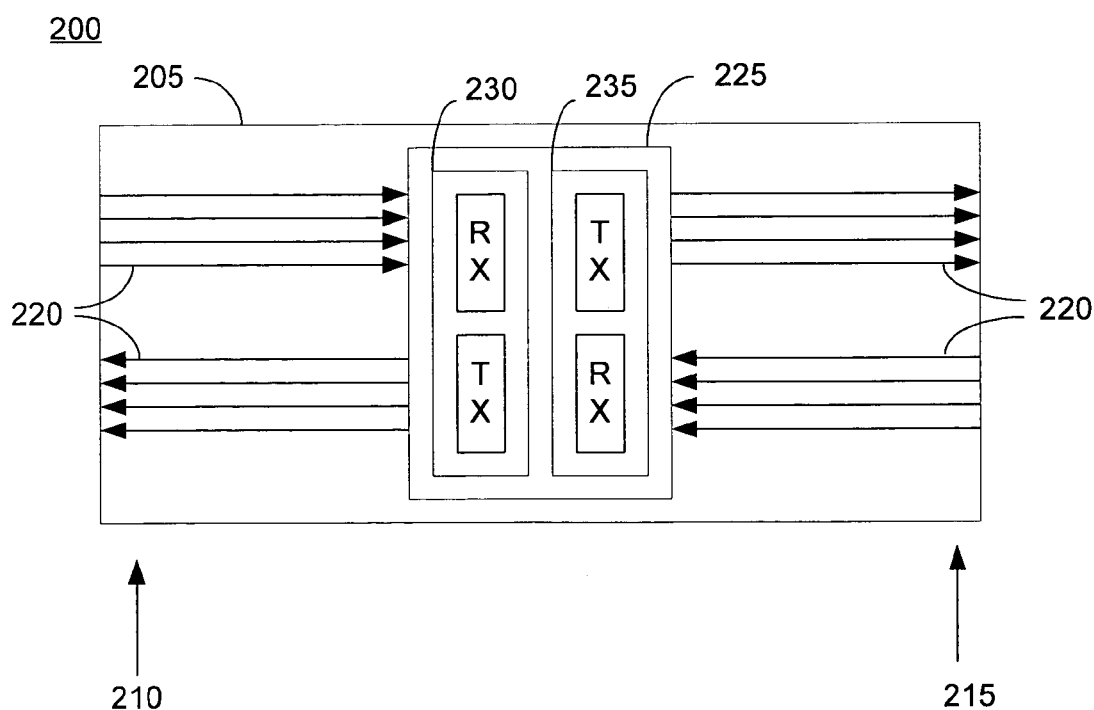
FIG. 2 is an exemplary apparatus, in accordance with some embodiments herein.

FIG. 2 illustrates an apparatus 200, in accordance with some embodiments herein. Apparatus 200 includes a length of flex cable 205 having a first end 210 and a second end 215, and a number of conductors 220 therein. Conductors 220 provide a conductive path from one end of flex cable 205 to the opposing end of the flex cable. Located at some point between first end 210 and second end 215 is a repeater 225. Repeater 225 may be electrically connected to at last one of conductors 220. Repeater 225 may re-transmit a signal on the at least one conductor.

Repeater 225 may include ports 230, 235 to receive a signal at repeater 225 and to transmit a signal from repeater 225. Ports 230, 235 may each have a transmitter (TX) and a receiver (RX) to transmit and receive signals, respectively.

Figure 3:
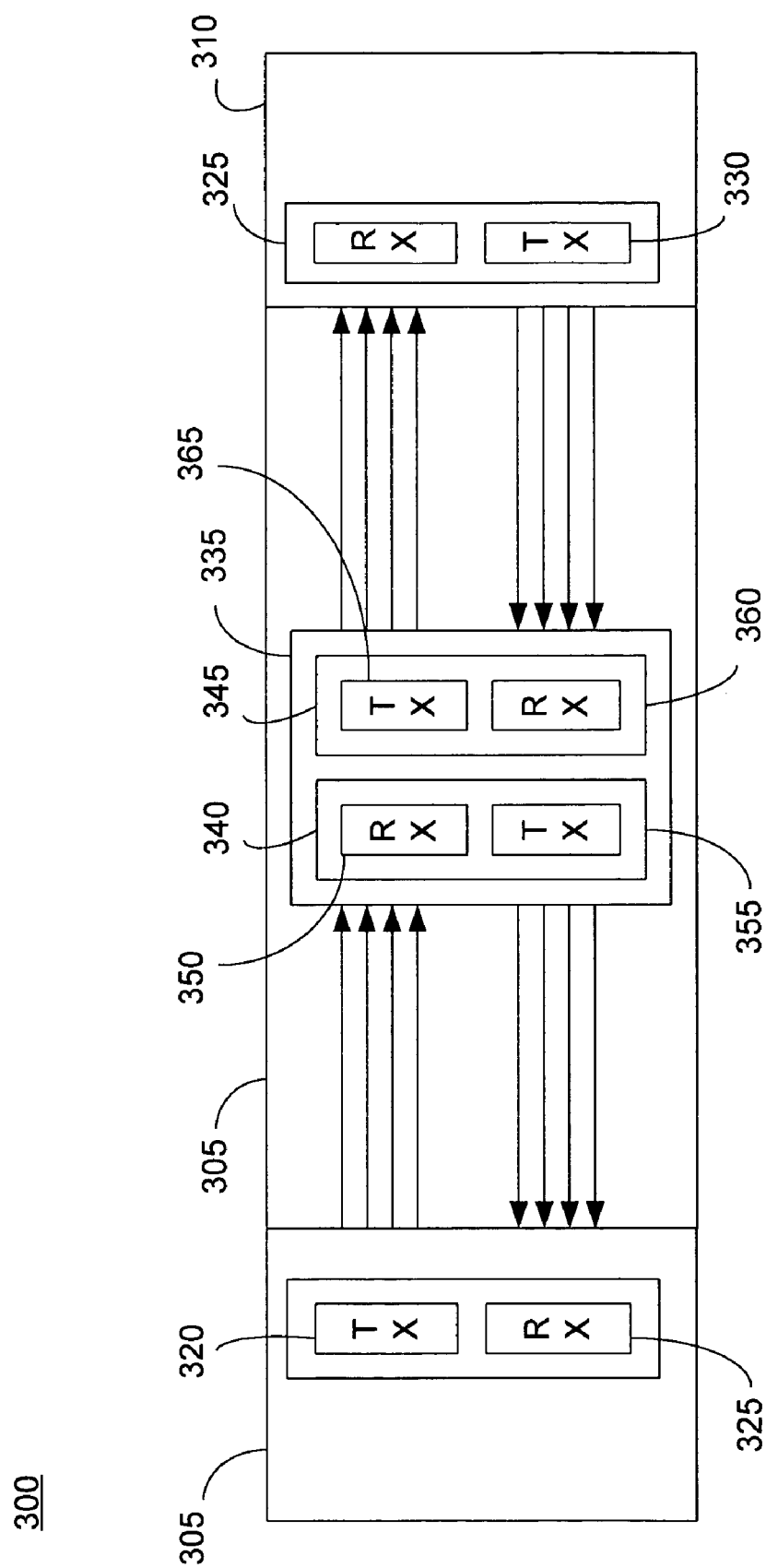
FIG. 3 is a schematic diagram of an apparatus, according to some embodiments herein.

In some embodiments, a repeater may include both transmitter and receiver functionality so that an interconnect hereof may function as a bi-directional interconnect between bi-directional communication devices. FIG. 3 is an exemplary illustration of an apparatus 300 interfaced with two communication devices 305, 310. For example, device 305 is a CPU having a transmit port 315 and a receiver port 320 and device 310 (e.g., a CPU or an input output hub, IOH) has a receiver port 325 and a transmit port 330. Receiver ports 320, 325 may be used to receive a signal and transmitters 315, 330 may be used to transmit a signal. CPU 305 and device 310 may each transmit and receive signals over conductors in flex cable 305. Repeater 335 may include two ports, port 340 and port 345. Ports 340, 345 may include a transmitter and a receiver. Port 340 comprises receiver 350 and transmitter 355. Port 345 comprises receiver 360 and transmitter 365. Ports 340, 345 may be adapted to accommodate a number of different conductors and signals.

In some embodiments, flex cable 305 and repeater 335 may combine to provide a mechanism to transmit signals over long distances (e.g., channels over 20 inches) with an improved frequency response. For example, transmission of data over long lengths at a high frequency (e.g., about 10 Ghz) may be achieved in some embodiments.

Figure 4:
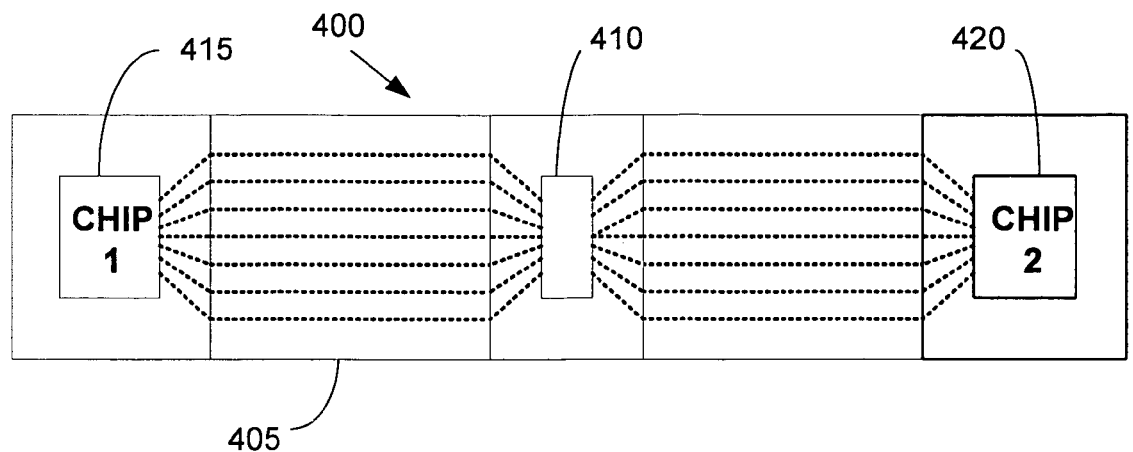
FIG. 4 is an exemplary illustrative depiction of an apparatus, in accordance with some embodiments herein.

FIG. 4 is an exemplary interconnect 400, in accordance with some embodiments herein. Interconnect 400 includes flex cable 405 and repeater 410. Interconnect 400 connects chip 415 to chip 420. Chips 415 and 420 have a conductor spacing of about 10 mils per pair of wires. Flex cable 405 may have a conductor spacing of about 20 mils per pair. Since interconnect 400 may be used as a main signal transmission medium in some applications, a mechanism to connect between different conductor spacings (i.e., pitches) may be provided by interconnect 400, in accordance with some embodiments herein. A device, such as an interposer, may be provided between chip die 420 having a first pitch (e.g., 10 mils) and flex cable 405 having a second pitch (e.g., 20 mils). In this manner, electrical connectivity may be maintained between chip 420 and interconnect 400.

In some embodiments, the inclusion of a device to connect the interconnect hereof between conductors of differing pitches may allow a close connection between a device such as, for example, a chip and the interconnect, and possibly avoiding discontinuities associated with traversing a PCB.

Figure 5:
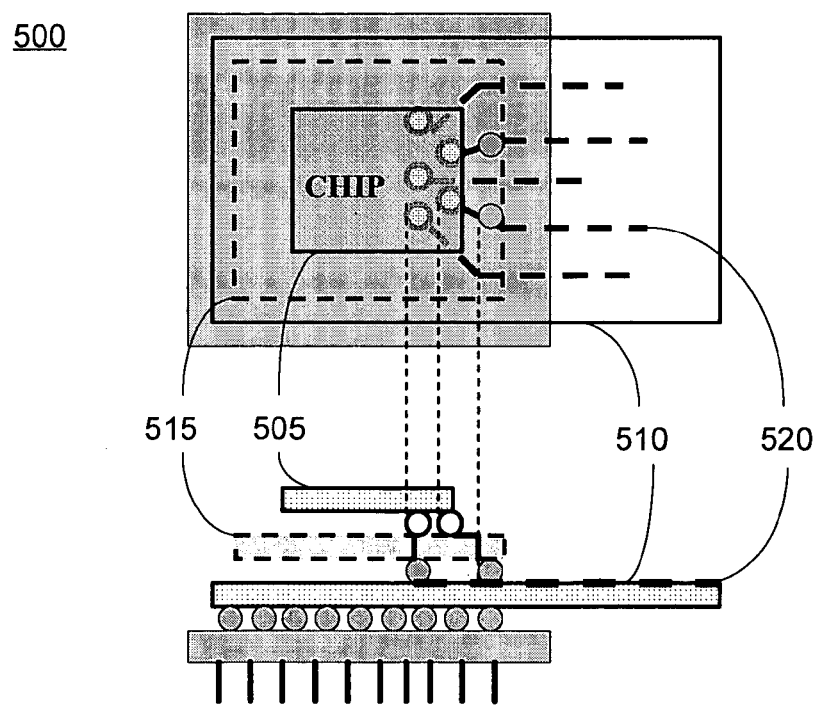
FIG. 5 is a schematic diagram of an apparatus, in accordance with some embodiments herein.

FIG. 5 is an exemplary illustration of an apparatus 500 and method for connecting devices of differing pitches. Chip 505 has conductors spaced at about 10 mils whereas flex cable 510 has conductors 520 spacing of about 20 mils. FIG. 5 provides both a side view and a top view of apparatus 500, with the same items in each view identified with the same reference number. As shown, interposer 515 is placed between chip 505 and flex cable 510. An upper surface of interposer 515 has conductor connection points spaced about 10 mils apart to interface with chip 505 and a lower surface with conductor connection points spaced about 20 mils apart to interface flex cable 510.

Apparatus 500 provides a mechanism to convert between different conductor densities. In some embodiments, reductions in flex or PCB manufacturing costs may be realized since the flex or PCB need not provide a conductor density transformation.

It should be appreciated that while FIG. 5 illustrates a mechanism to connect a chip or device package to an interconnect hereof, a similar type of connection may be used in some embodiments to connect a repeater of an interconnect hereof to flex cable.

Figure 6:
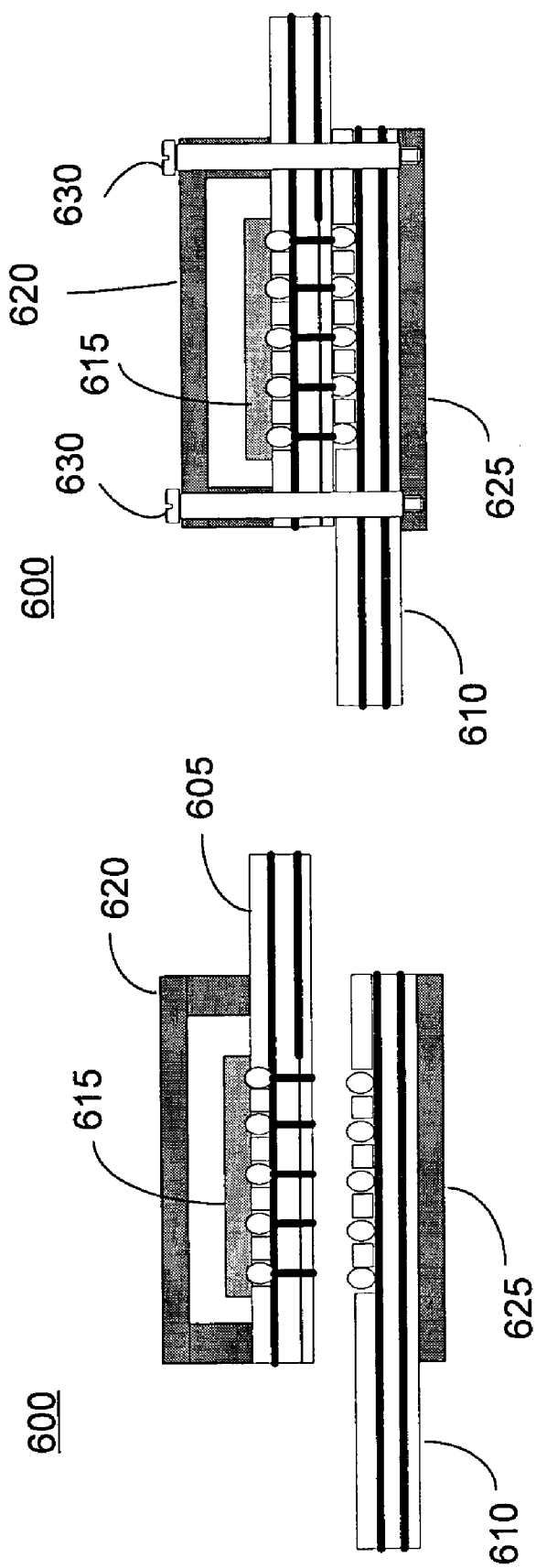
FIGS. 6A and 6B are exemplary depictions of an apparatus having a mechanical support structure, in accordance with some embodiments herein.

FIGS. 6A and 6B are illustrations of exemplary support structure to add support to an interconnect 600 having a flex cable and repeater, in accordance with some embodiments herein. FIG. 6A illustrates a first flex cable 605 to connect to a second flex cable 610. It should be understood that CPUs and/or other devices (not shown) may be connected to flex cables 605 and 610. Repeater 615 is provided to, for example, re-transmit signals transmitted on the conductors of flex cables 605, 610. Since repeater 615 may be connected directly to a flex cable without any support from, for example, a PCB, a clamp comprising a support front portion 620 and a support back portion 625 may add support in a vicinity of the connection of repeater 615 and flex cables 605, 610. Front support portion 620 may anchor near opposing sides of repeater 615 and be physically connected to support back portion 625 by any number of devices, techniques, and methods for physical attachment. For example, screws 630 may be used as shown in FIG. 6B to tie support front portion 620 to support back portion 625.

It should be understood that a support to add physical support (e.g., rigidity, robustness, etc.) to the connection area of a repeater and a flex cable in embodiments herein may vary.

In some operational environments, logic capabilities of a system may be improved (e.g., reductions in delays) and yet analog performance may suffer (e.g., voltage reductions, lower impedance mirrors, etc.). In some embodiments, an interconnect hereof including flex cable and a repeater may be used to drive a portion of a channel to achieve improved analog characteristic performance. Other communication methods may be used for the logic portion of the channel.

Figure 7:
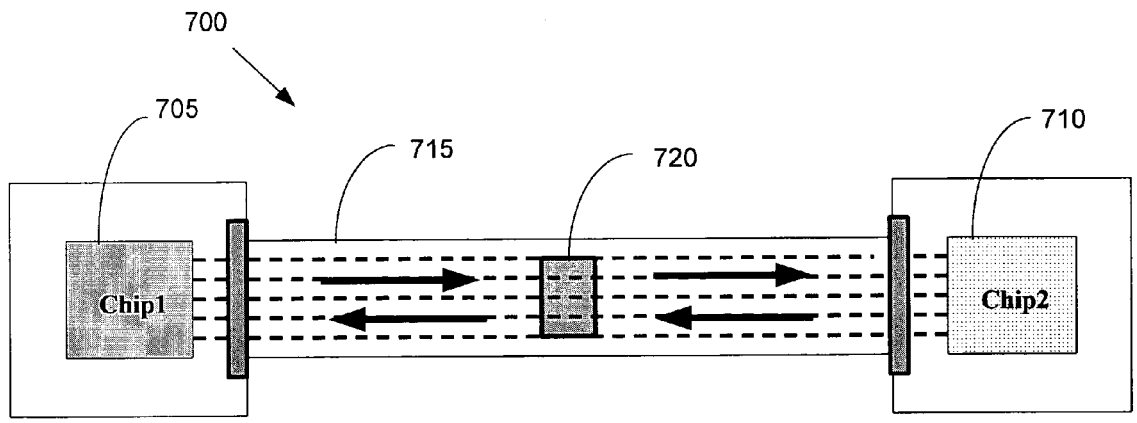
FIG. 7 is a schematic diagram of an apparatus, in accordance with some embodiments herein.

Referring to FIG. 7, repeater 720 attached to flex cable 715 may be fabricated in an analog process and placed between chip 705 and chip 710 to provide a stronger drive of the analog signals. Chip 705, for example, may be implemented in a CMOS logic process and handle logic functions using direct connections with a PCB connected thereto.

Figure 8:
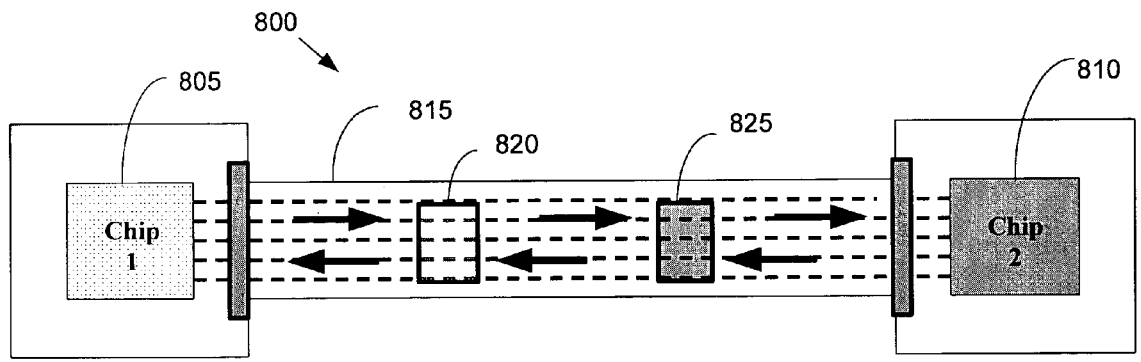
FIG. 8 is a schematic diagram of an apparatus, in accordance with some embodiments herein.

In some embodiments and applications, the distance to be traversed by an interconnect herein may benefit from more than one repeater between the ends of the flex cable of the interconnect. FIG. 8 illustrates such an implementation. Chips 805 and 810 are connected together by an interconnect 800 comprising flex cable 815 and two repeaters 820, 825. Repeater 820 may receive a signal from chip 805, amplify the signal to a certain level, and transmit the signal towards chip 825. The signal transmitted from chip 820 may be received by repeater 825, amplified to a certain level, and transmitted to chip 810. A similar process may occur for a signal transmitting from chip 810 and being received at chip 805.

Figure 9:
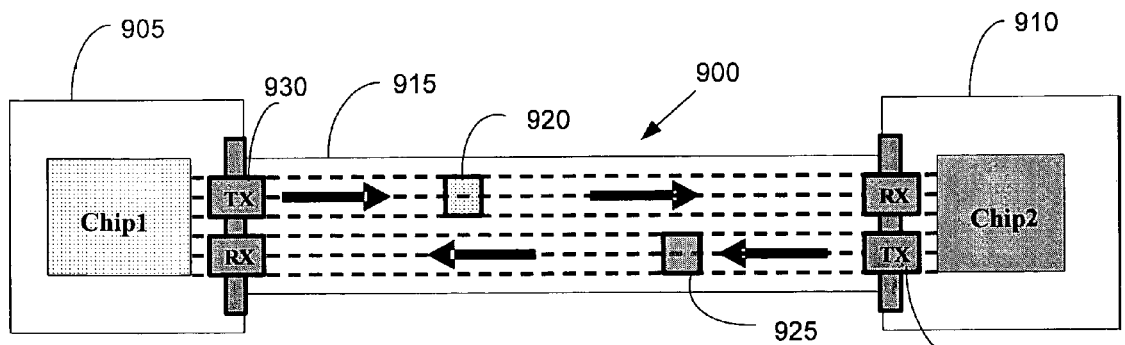
FIG. 9 is a schematic diagram of an apparatus, in accordance with some embodiments herein.
Figure 10A:
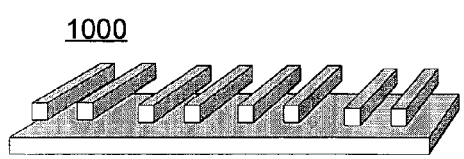
FIG. 10 is a schematic diagram of an apparatus, in accordance with some embodiments herein.

In some embodiments, a high-voltage repeater may be used that can transmit farther than a transmitting source. FIG. 9 illustrates an interconnect 900 comprising flex cable 915 comprising two high-voltage repeaters 920, 925. High-voltage repeaters 920, 925 are each placed closer to a transmitter 930, 935, since the transmitter functionality of repeaters 920, 925 is used to improve and/or compensate for the transmission power of the source transmitter. In some embodiments, since the high-voltage repeaters improve and/or compensate for the transmission power of the source transmitter, the repeater may be split and placed closer to transmitters 930, 935 as illustrated.

In some embodiments, a repeater may reduce or off-load some of the power budget of a CPU or other device connected to an interconnect of an in accordance with some embodiments herein. For example, high-voltage repeaters 920, 925 may alleviate some power constraints on chips 905, 910 by reducing a need to have chips 905, 910 include power hungry drivers. Accordingly, an amount of heat generated by chips 905, 910 (e.g., a CPU) may be reduced. Power for a system may thus be partition among various components, including some interconnect embodiments herein.

It should be appreciated that an interconnect in some embodiments herein may be used to connect, for example, CPUs, computer assemblies, memory hubs motherboard components, motherboards to daughterboards, and other devices. In some embodiments, an interconnect herein may span between about 10 inches and 50 inches, more particularly, about 20 inches to about 40 inches.

Figure 10B:
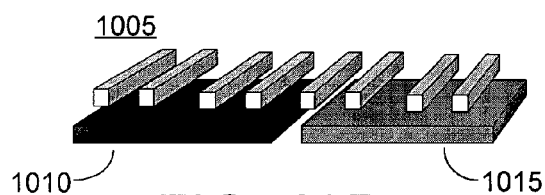
Figure 10C:
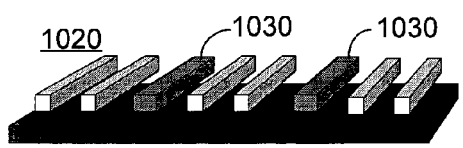

In some embodiments, a power trace for delivering power to, for example, a repeater connected to a flex cable herein may be implemented as microstrip 1000 (FIG. 1A), a microstrip 1005 with split power 1010 and ground 1015 plates (FIG. 10B), and a microstrip 1020 with shielded power traces 1030 (FIG. 10C).

Figure 11A:
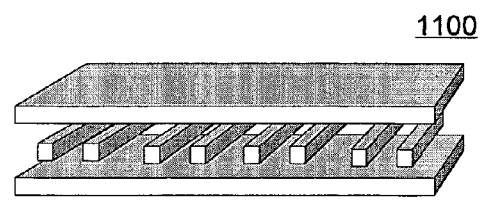
FIG. 11 is a schematic diagram of an apparatus, in accordance with some embodiments herein.
Figure 11B:
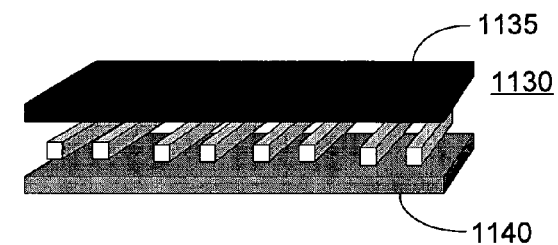
Figure 11C:
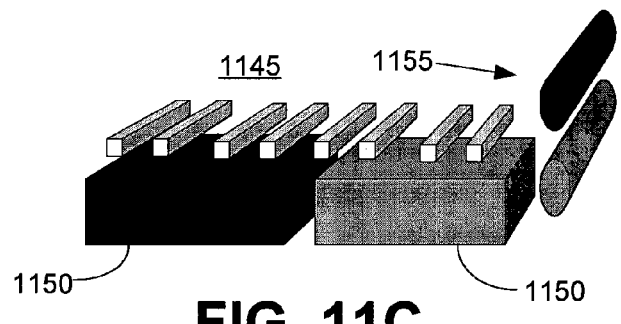

In some embodiments, a power delivery trace for flex cable herein may be implemented as stripline 1100 (FIG. 11A), a stripline 1130 with split power 1135 and ground 1140 plates (FIG. 11B), and a stripline 1145 with a thick power supply flex 1150 to reduce current density and lower resistance, or power may be supplied to a repeater using dedicated wires 1155 (FIG. 11C).

The foregoing disclosure has been described with reference to specific exemplary embodiments thereof. It will, however, be evident that various modifications and changes may be made thereto without departing from the broader spirit and scope set forth in the appended claims.

What is claimed is:

1. An apparatus comprising:
   a flex cable terminating at a first end and a second end and having a plurality of conductors therein; and
   a repeater circuit disposed between the first end and the second end and connected to at least one of the plurality of conductors to re-transmit a signal transmitted on the at least one of the plurality of conductors, wherein the repeater comprises at least one of a receiver to receive an incoming signal and a transmitter to transmit an outgoing signal.

2. The apparatus of claim 1, wherein the plurality of conductors provide an electrical connection between the first end and the second end.

3. The apparatus of claim 1, wherein the repeater amplifies the signal on the at least one conductor.

4. The apparatus of claim 1, further comprising at least one additional repeater disposed between the first end and the second end of the flex cable.

5. The apparatus of claim 1, further comprising a mechanical support structure to add support to a connection of the repeater to the flex cable.

6. A system comprising
 a flex cable terminating at a first end and a second end of the flex cable and having a plurality of conductors therein;
 a repeater circuit disposed between the first end and the second end and connected to at least one of the plurality of conductors to re-transmit a signal transmitted on the at least one of the plurality of conductors; and
 a microprocessor connected to the first end or the second end of the flex cable to transmit signals on the at least one conductor.

7. The system of claim 6, wherein the repeater amplifies the signal on the at least one conductor.

8. The system of claim 6, wherein the repeater further comprises at least one of a receiver to receive an incoming signal from the microprocessor and a transmitter to transmit an outgoing signal to the microprocessor.

9. The system of claim 6, wherein the plurality of conductors provide an electrical connection between the first end and the second end.

10. The system of claim 6, further comprising a device to connect conductors of different pitch spacing and provide electrical connectivity therebetween.

11. The system of claim 6, further comprising at least one additional repeater disposed between the first end and the second end of the flex cable.

12. The system of claim 6, further comprising a mechanical support structure to add support to a connection of the repeater to the flex cable.

13. An apparatus comprising:
 a flex cable terminating at a first end and a second end and having a plurality of conductors therein;
 a repeater circuit disposed between the first end and the second end and connected to at least one of the plurality of conductors to re-transmit a signal transmitted on the at least one of the plurality of conductors, and
 a device to connect conductors of different pitch spacing and provide electrical connectivity therebetween.

14. The apparatus of claim 13, wherein the repeater amplifies the signal on the at least one conductor.

15. The apparatus of claim 13, wherein the repeater comprises at least one of a receiver to receive an incoming signal and a transmitter to transmit an outgoing signal.

16. The apparatus of claim 13, further comprising at least one additional repeater disposed between the first end and the second end of the flex cable.

17. The apparatus of claim 13, further comprising a mechanical support structure to add support to a connection of the repeater to the flex cable.

18. An apparatus comprising:
 a flex cable terminating at a first end and a second end and having a plurality of conductors therein; and
 a repeater circuit disposed between the first end and the second end and connected to at least one of the plurality of conductors to re-transmit a signal transmitted on the at least one of the plurality of conductors, wherein the flex cable comprises at least one of a microstrip and a stripline.

19. The apparatus of claim 18, wherein the repeater amplifies the signal on the at least one conductor.

20. The apparatus of claim 18, further comprising at least one additional repeater disposed between the first end and the second end of the flex cable.

21. The apparatus of claim 18, further comprising a mechanical support structure to add support to a connection of the repeater to the flex cable.

22. The apparatus of claim 18, further comprising a device to connect conductors of different pitch spacing and provide electrical connectivity therebetween.

23. The apparatus of claim 18, wherein the repeater comprises at least one of a receiver to receive an incoming signal and a transmitter to transmit an outgoing signal.

* * * * *